(12) United States Patent
Radle et al.

(10) Patent No.: US 7,633,282 B2
(45) Date of Patent: Dec. 15, 2009

(54) MULTI-SCANNER DEVICE HAVING A DETACHABLE OUTLET TESTER

(75) Inventors: Patrick J. Radle, Mequon, WI (US); Daryl C. Brockman, Shorewood, WI (US); David L. Wiesemann, Pewaukee, WI (US)

(73) Assignee: Actuant Corporation, Glendale, WI (US)

( * ) Notice: Subject to any disclaimer, the term of this patent is extended or adjusted under 35 U.S.C. 154(b) by 169 days.

(21) Appl. No.: 11/840,616

(22) Filed: Aug. 17, 2007

(65) Prior Publication Data

US 2008/0042657 A1 Feb. 21, 2008

Related U.S. Application Data

(60) Provisional application No. 60/822,701, filed on Aug. 17, 2006.

(51) Int. Cl.
*G01V 3/15* (2006.01)
(52) U.S. Cl. .......................... 324/67; 324/508

(58) Field of Classification Search .................. 324/67, 324/508; 33/528, 760
See application file for complete search history.

(56) References Cited

U.S. PATENT DOCUMENTS

| | | | |
|---|---|---|---|
| 3,952,244 A | 4/1976 | Spear | |
| 4,096,434 A | 6/1978 | Meyer | |
| 4,099,118 A | 7/1978 | Franklin et al. | |
| 4,859,931 A | 8/1989 | Yamashita et al. | |
| 4,929,887 A | 5/1990 | Robitaille et al. | |
| 5,625,285 A | 4/1997 | Virgilio | |
| 6,211,662 B1 | 4/2001 | Bijawat et al. | |
| 6,215,293 B1 | 4/2001 | Yim | |
| 2006/0103390 A1* | 5/2006 | Simmons et al. | 324/508 |
| 2007/0210785 A1* | 9/2007 | Sanoner et al. | 324/67 |

* cited by examiner

*Primary Examiner*—Vincent Q Nguyen
(74) *Attorney, Agent, or Firm*—Quarles & Brady LLP

(57) ABSTRACT

A multi-scanner device having a detection unit and an outlet tester that can be selectively connected together for convenient use and easy storage. Preferably, a plug on the outlet tester is inserted into a non-functional socket located on the detection unit to form a multi-scanner device with a detachable outlet tester.

14 Claims, 4 Drawing Sheets

MULTI-SCANNER DEVICE HAVING A DETACHABLE OUTLET TESTER

CROSS-REFERENCE TO RELATED APPLICATIONS

This application claims the benefit of U.S. Provisional Patent Application No. 60/822,701 filed Aug. 17, 2006.

STATEMENT REGARDING FEDERALLY SPONSORED RESEARCH OR DEVELOPMENT

Not Applicable

BACKGROUND OF THE INVENTION

Wall sensors and scanners, such as stud finders, are well-known and commonly used by tradesmen and do-it-yourselfers in construction projects to locate objects located below the surface of a wall. One type of stud finder is a single mode electronic stud finder, which typically includes a capacitor for detecting changes in the capacitance as the stud finder moves across the surface of the wall. A change in capacitance indicates that the dielectric constant of the surface has changed due to the presence of an object behind the surface of the wall.

In addition to single mode wall scanners, multifunction detection units have been developed which can be toggled between various modes of detection. For example, in addition to the circuitry described above, a stud finder might include separate circuitry for detecting metal behind a wallboard and for detecting an AC voltage behind a wallboard to determine whether the wall has a live wire behind it. An AC voltage detector may alert the user to the location of electrical wiring in the wall and could prevent the user from cutting into the wire. Alternatively, an AC voltage detector could aid the user in finding the wire if the user is performing electrical work.

Electrical outlet testers are another commonly used tool for electrical work. These devices are typically self-contained, and designed to be plugged into a standard electrical outlet having hot, neutral, and ground connections to determine whether the outlet is properly wired. These devices allow the wiring of an electrical outlet to be verified easily, without the need for meters or other devices.

Certain construction projects involving electrical work require both a detection unit and an electrical outlet tester. For example, installing a new outlet requires that the tradesman determine the location of existing electrical outlets and wall studs, wire the new outlet, and ensure that the outlet is correctly wired. If the outlet includes a ground fault circuit interrupter, it requires testing. However, the need for two separate tools creates a problem because the user needs to (1) buy two separate tools, and (2) actually find each tool when he or she wants to use them.

BRIEF SUMMARY OF THE INVENTION

The present invention combines a detection unit and an outlet tester for convenient use and easy storage. The plug on the outlet tester can be inserted into a non-functional socket located on the detection unit to form a multi-scanner device with a detachable outlet tester.

In typical use, the user scans the surface of the wall with the detection unit, which may have multiple scanning functions, to locate studs or electrical wiring. If the user needs an outlet tester, then he or she simply detaches the outlet tester from the detection unit. Then, once the outlet has been tested, the user can reattach the outlet tester to the detection unit, reforming the multi-scanner device.

These and other features and advantages of the invention will appear in the detailed description which follows. In the description, reference is made to the accompanying drawings which illustrate a preferred embodiment of this invention.

DETAILED DESCRIPTION OF THE PREFERRED EMBODIMENT

Figure 1:
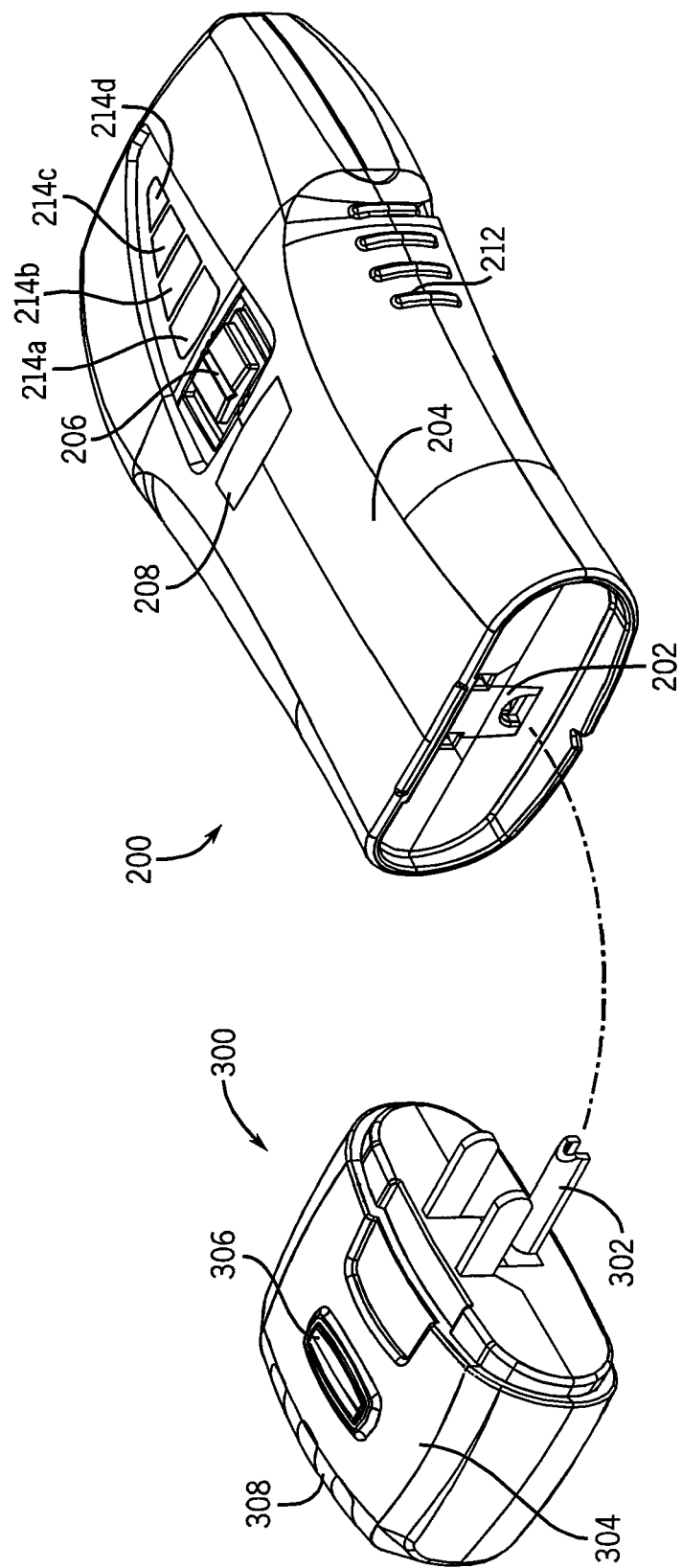
FIG. 1 is a perspective view of a multi-scanner device shown when separated into its detection unit and outlet test components.

Referring now to FIG. 1, a multi-scanner device 100 includes a detection unit 200 and an outlet tester 300. The detection unit 200 includes circuitry for providing wood stud detection, metal detection, and a non-contact AC voltage detection as described below. The outlet tester 300 provides an outlet wiring test and a ground fault circuit interrupter test. The detection unit 200 has an interface that can be, as shown here, a socket 202, and the outlet tester 300 has a mating plug 302. When the outlet tester 300 is not in use, the plug 302 can be inserted in the socket 202 for easy storage of the outlet tester 300.

The detection unit 200 has a housing 204 in which the circuitry for performing the available scanning modes is encased. A scan mode switch 206 is located on the front face of the detection unit 200. The scan mode switch 206 permits the user of the detection unit 200 to toggle among the available scanning modes. In FIG. 1 the scan mode switch 206 is a three-way sliding switch. An LED switch selection indicator 208 is located on the front face of the detection unit 200 below the scan mode switch 206. The LED switch selection indicator 208 uses LED lights to display which of the available scanning modes the user has selected with the scan mode switch 206.

Figure 2:
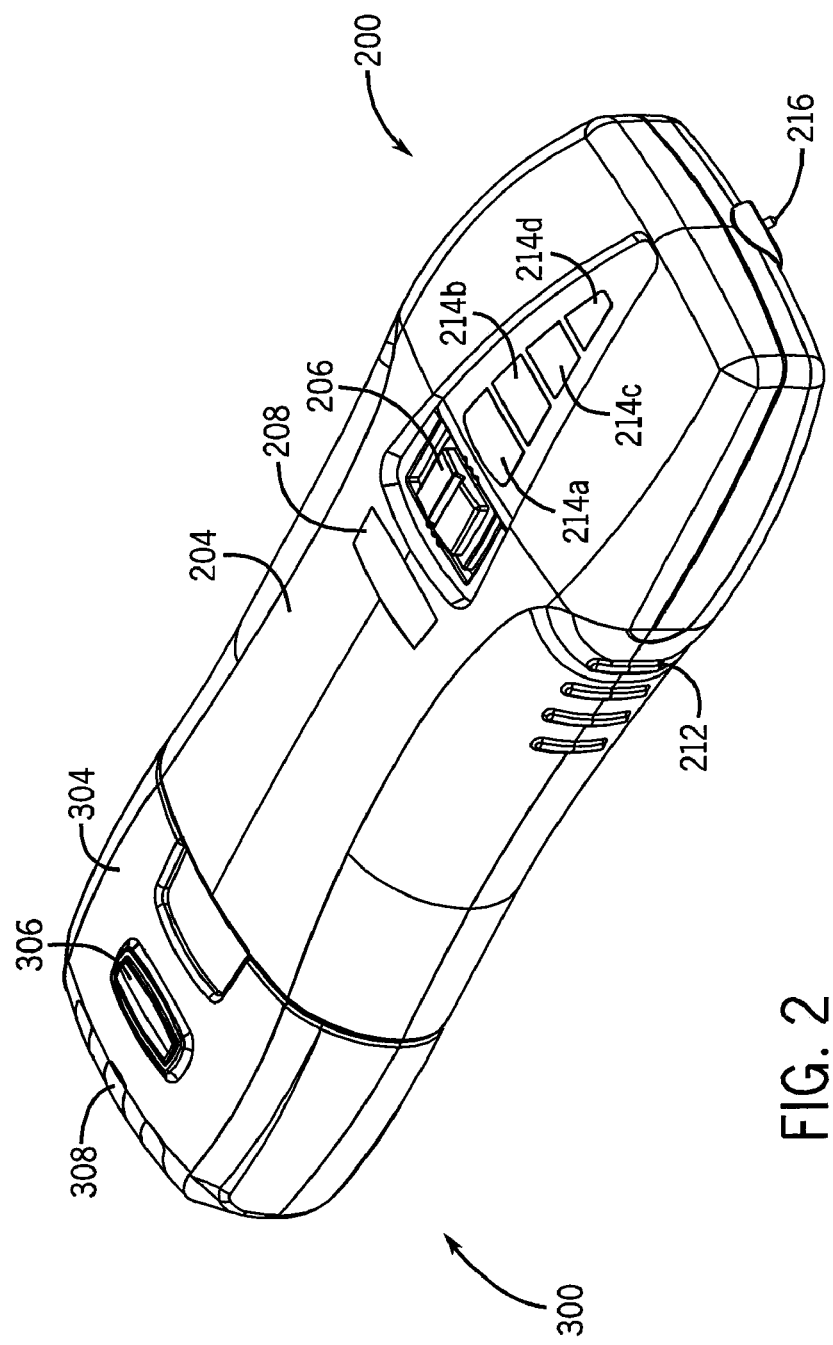
FIG. 2 is a perspective view of the multi-scanner device in which the outlet tester has been attached to the detection unit.
Figure 3:
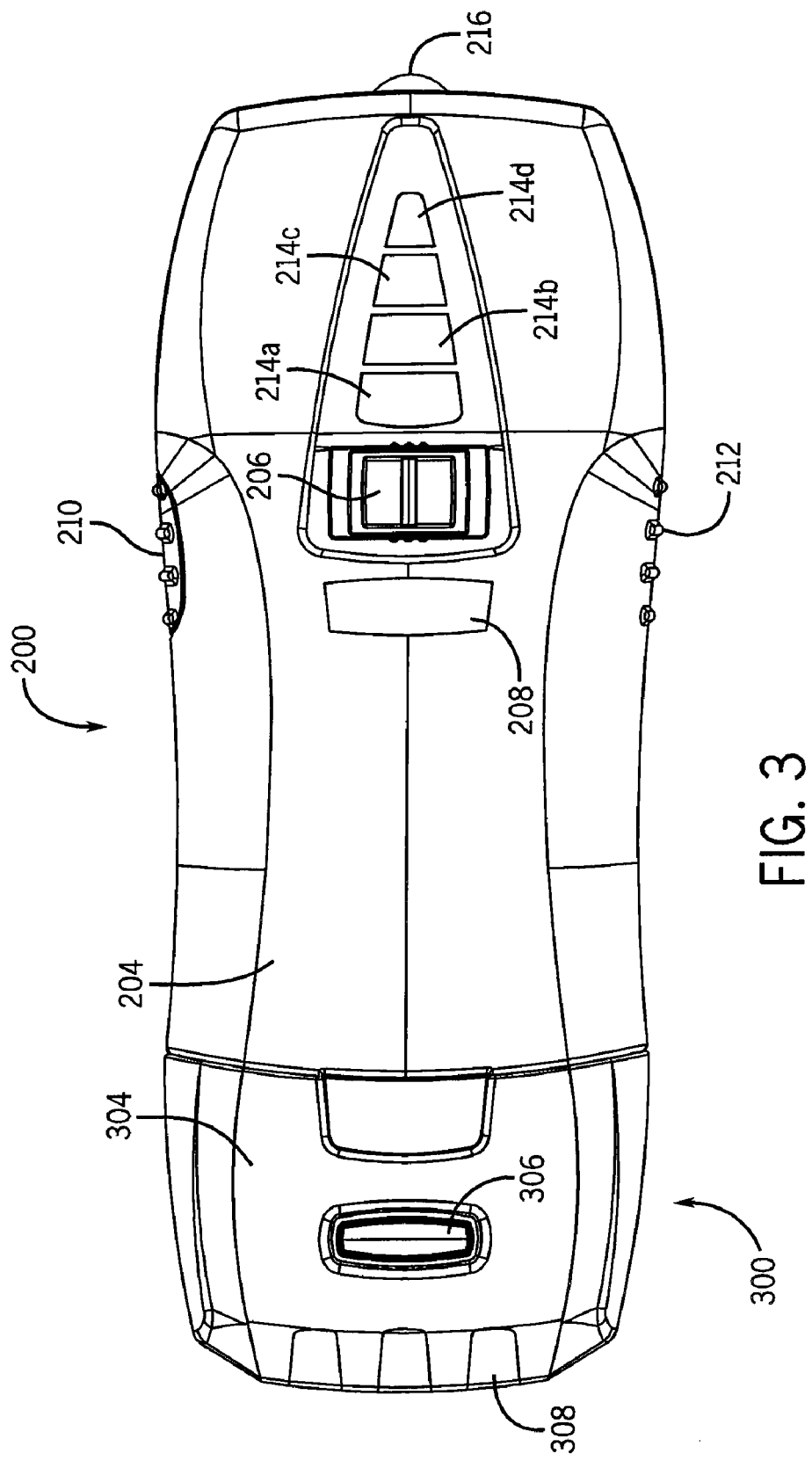
FIG. 3 is a front view of the multi-scanner device shown in FIG. 3.

The user presses an on-off switch 210 located on the left side of the detection unit 200, which is shown in FIG. 3, to activate the circuitry of the detection unit 200 and perform the selected mode of operation. The surface of the on-off switch 210 and the right side of the unit have ridged grips 212 which make the detection unit 200 easy to hold and unlikely to slip out of the user's hands. A set of LED position indicators 214*a-d*, located on the front face of the detection unit 200, indicate when the detection unit 200 has detected an object behind the scanned surface. A tip 216, shown in FIG. 2, is located on the nose of the detection unit 200 for marking a location on a wall.

In typical use, the user selects the scanning mode using the scan mode switch 206, holds the detection unit 200 up to a wallboard, presses and holds the on-off switch 210, and moves the detection unit 200 across the wall. When the circuitry of the detection unit 200 detects the selected material or AC voltage of the selected mode behind the wallboard, the LED position indicators 214*a-d* begin to illuminate. An LED position indicator 214*a* first illuminates when the circuitry weakly detects the selected material or AC voltage. As the user continues to move the detection unit 200 across the wallboard, if the circuitry detects an even stronger presence of the selected material or AC voltage, then the LED position indicator 214b will also illuminate. Further increases in signal will result in LED position indicator 214c illuminating, and LED position indicator 214d illuminating. In one possible configuration of the detection unit 200, when all of the LED position indicators 214a-d are lit, the user will be near the center of the detected object, such as a wood stud. The tip 216 might then be used to mark the location on the wall by making an indentation. The tip 216 may also function as a non-contact AC voltage detector antenna.

It should be appreciated that the detection unit 200 may be capable of one or more scanning functions including, but not limited to, wood stud detector, metal detector, and non-contact AC voltage detector. The scan mode switch 206 is not required and is only preferable if the detection unit 200 is capable of performing more than one scanning function. Additionally, the circuitry for each scanning function in the housing 204 may operate independently of each other or share common elements. Moreover, in some applications, the circuitry may perform multiple scanning functions simultaneously, eliminating the need for the scan mode switch 206. Circuitry for performing these functions are well known and not in need of a detailed description herein.

It should be further appreciated that although FIG. 1 illustrates geometry compatible with a Type B three-pin plug and socket, typically used in the United States for 115 volt, 60 hertz power supplies, any type of socket and plug combination might be used to connect the detection unit 200 and the outlet tester 300. However, the detection unit 200 and the outlet tester 300 might also be connected using an interface or attachment means in addition to the plug 302 and socket 202. For example, different types of plug/socket combinations may be used for different voltage levels, or to match the plug/socket combinations used in a particular region. Additionally, the plug 302 may simply fit into a cavity in the housing 204, and the detection unit 200 and the outlet tester 300 are in some other way adapted to be selectively connected together. Various other types of connectors for coupling the outlet tester 300 to the detection unit 200, including hook and loop fasteners, sliding attachment members, threaded fasteners, and other types of devices can also be used. In addition, irrespective of the type of connection used, a snap fit connection can be used. Thus, the presence of a socket 202 on the detection unit 200 should not be considered limiting.

It should be further appreciated that the LED switch selection indicator 208 and the LED position indicators 214a-d might be complemented or replaced by other forms of audible or visual alarms. For example, in addition to the LED position indicators 214a-d, the detection unit 200 may also provide a variable or multi-tone audible alarm indicating the detection strength. Likewise, instead of utilizing LED lights, the detection device might have an alternate form of visual feedback, such as a liquid crystal display, or provide aural feedback, such as beeps or other sounds, through a speaker system provided in the device and which is transmitted through holes in the housing of the device (not shown).

The outlet tester 300 has circuitry for performing its electrical outlet testing functions inside a housing 304. In typical use, the plug 302 of the outlet tester 300 is placed into an electrical socket, and the LEDs 308 are activated to illustrate either that the wiring is good, or a fault in the wiring, depending on the pattern. The disclosure of Virgilio U.S. Pat. No. 5,625,285, assigned to A.W. Sperry Instruments, which describe the operation and feedback provided by such an outlet tester, is hereby incorporated by reference. Although a series of LEDs are shown here for providing verification of wiring, an LCD display including testing result and wiring correction information can also be provided instead of or in addition to the LEDs 308.

In addition to the wiring test and verification, an outlet switch 306 may be provided to activate a GFCI test from the outlet tester 300. When testing a GFCI-enabled wall circuit, the user activates the switch 306, which shorts out the wall socket to activate and verify the circuit breaker that is built into the GFCI-enabled wall socket. In alternative embodiments, the outlet tester 300 can also be provided with an arc-fault tester function.

It should be appreciated that the outlet tester 300 may be capable of one or more electrical socket testing functions including, but not limited to, an outlet faulty wiring tester and a ground fault circuit interrupter tester. Thus, the outlet mode switch 306 is not required and is only preferable if the outlet tester 300 has circuitry for performing more than one electrical socket testing function. The circuitry for performing each of the outlet testing functions in the housing 304 may operate independently of each other or share common elements.

FIG. 2 provides a perspective view and FIG. 3 provides a top view of the multi-scanner device 100 after the detection unit 200 and the outlet tester 300 have been connected by inserting the plug 302 into the socket 202. FIG. 2 clearly shows the tip 216 which may be used to mark a wall or perform as a non-contact AC voltage detector. FIG. 3 clearly shows the on-off switch 210 which the user presses to engage the selected mode.

Figure 4:
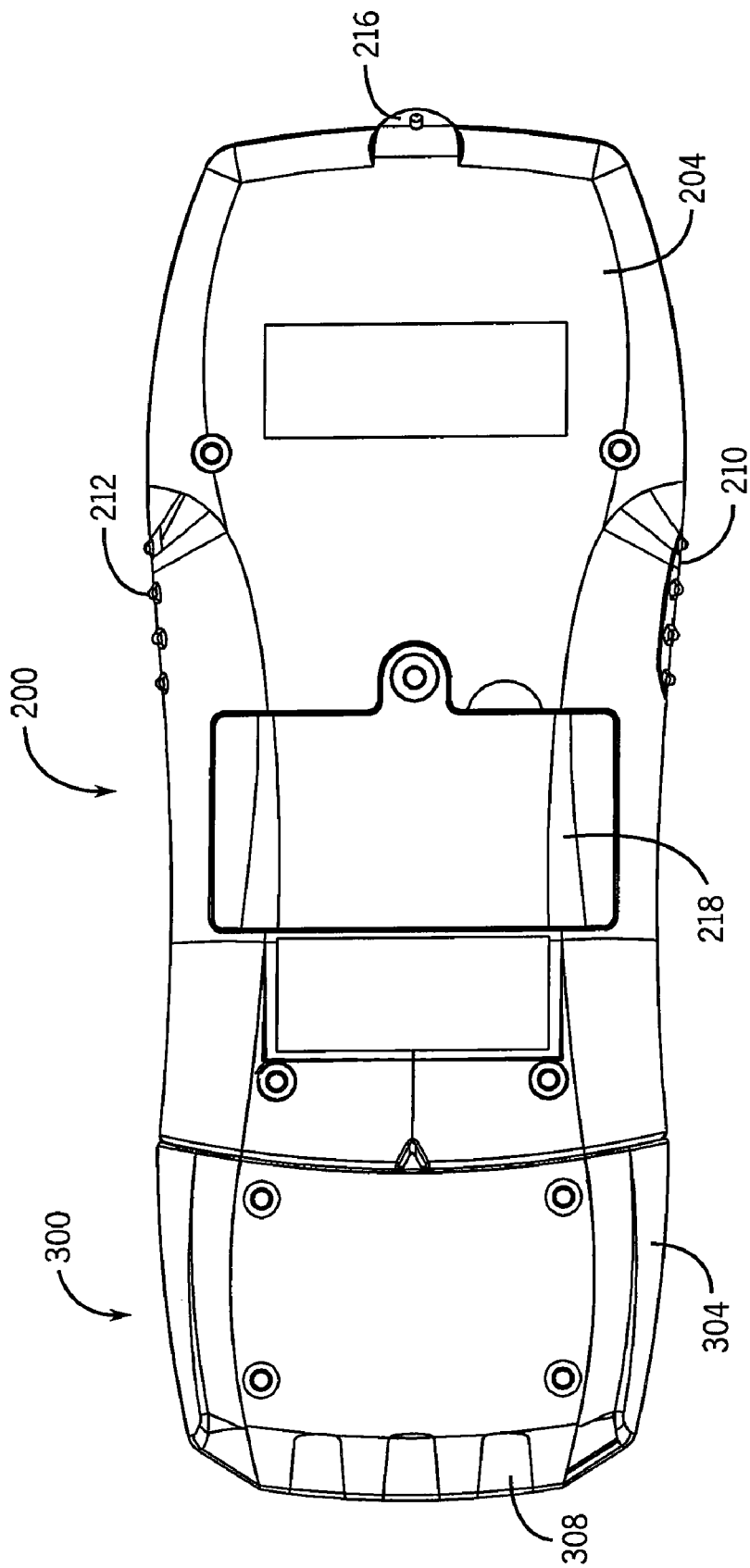
FIG. 4 is a back view of the multi-scanner device shown in FIG. 3.

FIG. 4 provides a back view of the multi-scanner device 100 after the detection unit 200 and the outlet tester 300 have been attached by inserting the plug 302 into the socket 202. A battery cover 218 holds the batteries in the detection unit 200.

It is specifically intended that the present invention not be limited to the embodiments and illustrations contained herein, but include modified forms of those embodiments including portions of the embodiments and combinations of elements of different embodiments as come within the scope of the following claims.

We claim:

1. A multi-scanner device comprising:
   a detection unit including circuitry for performing at least one scanning function and having an interface for attachment to an outlet tester; and
   an outlet tester including circuitry for performing at least one electrical wall outlet testing function and having a male plug for connection to a wall outlet;
   wherein the detection unit and the outlet tester are adapted to be selectively connected together at the interface.

2. The multi-scanner device of claim 1, wherein the detection unit includes circuitry for detecting at least one of a wood stud, a metal object, and an AC voltage.

3. The multi-scanner device of claim 2, wherein the detection unit includes a switch for selecting the scanning function.

4. The multi-scanner device of claim 3, wherein the detection unit includes a switch for activating the scanning function.

5. The multi-scanner device of claim 2, wherein the detection unit has a tip for marking a surface.

6. The multi-scanner device of claim 1, wherein the outlet tester includes circuitry for testing at least one of an outlet for faulty wiring and an outlet for a ground fault circuit interrupter.

7. The multi-scanner device of claim 6, wherein the outlet tester includes a switch for selecting between an outlet faulty wiring test and a ground fault circuit interrupter test.

8. The multi-scanner device of claim 1, wherein the plug is a Type B American three-pin grounded plug.

9. The multi-scanner device of claim 2, wherein the interface is a socket for mating with the Type B American three-pin grounded plug.

10. The multi-scanner device of claim 1, wherein the scanning function includes an audible alarm.

11. The multi-scanner device of claim 1, wherein the scanning function includes a visual alarm.

12. The multi-scanner device of claim 1, wherein the circuitry for performing the scanning function is located inside a housing for the detection unit, and the circuitry for performing the electrical socket testing function is located inside a housing for the outlet tester.

13. The multi-scanner device of claim 1, wherein the detection unit includes circuitry for detecting a wood stud, a metal object, and an AC voltage, and the outlet tester includes circuitry for testing an outlet for faulty wiring and an outlet for a ground fault circuit interrupter.

14. A multi-scanner device comprising:
- a detection unit including circuitry for detecting a wood stud, a metal object, and an AC voltage and having a socket; and
- an outlet tester including circuitry for testing an outlet for faulty wiring and an outlet for a ground fault circuit interrupter;
- wherein the detection unit and the outlet tester are adapted to be selectively connected together.

* * * * *